United States Patent
Nikitin

(10) Patent No.: US 11,736,117 B2
(45) Date of Patent: Aug. 22, 2023

(54) METHOD OF VERNIER DIGITAL-TO-ANALOG CONVERSION

(71) Applicant: Yury Alexandrovich Nikitin, Saint Petersburg (RU)

(72) Inventor: Yury Alexandrovich Nikitin, Saint Petersburg (RU)

(*) Notice: Subject to any disclaimer, the term of this patent is extended or adjusted under 35 U.S.C. 154(b) by 55 days.

(21) Appl. No.: 17/621,380

(22) PCT Filed: Jun. 30, 2020

(86) PCT No.: PCT/RU2020/050138
§ 371 (c)(1),
(2) Date: Dec. 21, 2021

(87) PCT Pub. No.: WO2021/002778
PCT Pub. Date: Jan. 7, 2021

(65) Prior Publication Data
US 2022/0360277 A1     Nov. 10, 2022

(30) Foreign Application Priority Data
Jul. 2, 2019   (RU) .......................... RU2019120873

(51) Int. Cl.
*H03M 1/66* (2006.01)
*H03M 1/68* (2006.01)
*H03M 1/74* (2006.01)

(52) U.S. Cl.
CPC .............. *H03M 1/68* (2013.01); *H03M 1/74* (2013.01)

(58) Field of Classification Search
CPC ................................. H03M 1/68; H03M 1/74
(Continued)

(56) References Cited

U.S. PATENT DOCUMENTS

| | | | | |
|---|---|---|---|---|
| 5,034,745 A | * | 7/1991 | Kelly ................... | H03M 1/182 341/155 |
| 5,153,592 A | * | 10/1992 | Fairchild ............. | H03M 1/1047 341/145 |
| 7,609,096 B1 | | 10/2009 | Chang et al. | |

OTHER PUBLICATIONS

International Search Report and Written Opinion of the International Searching Authority issued in International Application No. PCT/RU2020/050138 dated Nov. 6, 2020.

* cited by examiner

*Primary Examiner* — Peguy Jean Pierre
(74) *Attorney, Agent, or Firm* — Hoffmann & Baron, LLP

(57) ABSTRACT

A digital-to-analog conversion, including: converting signal Y using word $X=M+\alpha^{-\alpha}N$ having length $\Psi=\alpha+\beta$ digits, where M is high order digits of $\alpha$ long control word X, $\alpha^{-\alpha}N$ is low order digits of $\beta$ long control word X, wherein $\alpha \approx \beta$; subjecting analog signal Z to three conversions, wherein, in the first conversion, signal $Z_1$ is proportional to $M\alpha$ long high order digits of X, and to reference signal $Y_1$, where $Z_1 = Y_1 \times M$, in the second and third conversions, signals $Z_2$ and $Z_3$ are proportional to $N\beta$ long low order digits of X and to signals $Y_1$ and $Y_2$, respectively, where $Z_2 = Y_1 \times N$, and $Z_3 = Y_2 \times N$, wherein, before the conversions, $\alpha^{-\alpha}N$ low order digits of X are multiplied by $\alpha^{\alpha}$; and adding $Z_1$, $Z_2$, $Z_3$ to generate output signal $Z_0$, wherein $Y_1$ and $Y_2$ relate by $Y_2=Y_1(1\pm\alpha^{-\alpha})$, wherein $\alpha$ is the base of the numbering system, $\alpha$ is the number of digits, by which $\alpha^{-\alpha}N$ is shifted.

4 Claims, 2 Drawing Sheets

(58) Field of Classification Search
USPC .......................................... 341/145, 159, 144
See application file for complete search history.

METHOD OF VERNIER DIGITAL-TO-ANALOG CONVERSION

CROSS-REFERENCE TO RELATED APPLICATIONS

The present application is the U.S. National Phase of PCT/RU2020/050138, filed on 30 Jun. 2020, which claims priority to Russian Patent Application No. 2019120873, filed on 2 Jul. 2019, the entire contents of which are incorporated herein by reference.

BACKGROUND

Field

The invention relates to the field of electrical signals conversion, in particular, to converting digital information into an analog signal.

Related Art

Two main digital-to-analog conversion methods are known:

one involves summing unit reference signals, and the other one sums those reference signals which have different weights.

The first method makes use of only one reference value weighing only one quantum when generating the output analog signal and using binary control code (see [1. Tietze U., Schenk K. Semiconductor Circuit Engineering: Reference Manual. Translated from German. M. Mir, 1982.-512 pp., page 444, FIG. 24.1, and page 245 FIG. 24.2]).

The second method makes use of reference signals with weights that depend on a digit number, and only those reference signals are summed, for which there is a "one" in the respective input code digit when binary control code is used, or a significant non-zero digit in a non-binary control code, e.g., from 1 to 9 in a decade control code (see [2. Tietze U., Schenk K. Semiconductor Circuit Engineering: Reference Manual. Translated from German. M. Mir, 1982.-512 pp., page 446, FIG. 24.3, page 446 FIG. 24.5]).

Above-mentioned digital-to-analog converters generate reference values corresponding to values of digits of the input control code X from reference signal Y, which values are summed and form discrete values of output analog value Z.

A principle underlying the method of digital-to-analog conversion may be presented as shown in FIG. 1.

Consider a parallel digital-to-analog converter (DAC) shown in FIG. 1, which has an input for a single analog (reference)—current or voltage—signal Y, digital control inputs X clocked in time with interval t, and analog signal—current or voltage—Z output, wherein the reference signal Y and output signal Z (input current or voltage and output current or voltage) may be either identical (input current or voltage and output current or voltage) or different (input voltage or current and output current or voltage).

Conversion of digital control code X in output analog signal Z is performed in one or more clock periods t, i.e., in an ultimate case, in one clock period all digits of control word X are converted into the analog value Z. Therefore the DAC_0 which implements such conversion method is referred to as parallel.

Consider the digital control code to be a position code, and the type of numeral system with base a is not important—it may be binary (a=2), decimal (a=10), hexadecimal (a=16), or any other type.

For example, a number (word) X normalized to "one" in digital binary code is:

$$0 \leq X = \sum_{k=0}^{\psi-1} q_k \times \alpha^{-k} < 1,$$

where $\alpha=2$; $q_k \in [0,1]$; $\psi$ is the number of bits in the word X.

For a binary DAC, the output signal is determined as follows:

$$Z = hY(\alpha_{k-1} 2^{k-1} + \alpha_{k-2} 2^{k-2} + \ldots + \alpha_0 2^0),$$

where Y is the reference signal; $q \in (\alpha_0, \alpha_1, \ldots, \alpha_{k-1}) \equiv [0, 1]$ are bit coefficients which may take the values "0" or "1"; $k=0, 1, \ldots \psi-1$ is binary digit number; and h is proportionality factor.

In the case of a decimal digital control code, the number X normalized to "one" is:

$$0 \leq X = \sum_{k=0}^{\psi-1} q_k \times \alpha^{-k} < 1,$$

where $\alpha=10$; $q_k \in [0, 1, \ldots, 9]$; $\psi$ is the number of decimal digits in the word X.

Digital-to-analog converters generate reference signals which correspond to the values of the digits of the input control code X from reference signal Y, the generated signals being summed and forming discrete values of output analog value Z.

Internal contents of DAC_0 and its operation algorithm (internal operations) are not of fundamental importance for further discussion.

Analog signal Z is generated at the output of DAC_0 from analog reference signal Y input therein by means of controlling the DAC_0 with a $\psi$ digits long digital code X the reference signal Y being the base of analog dimensional scale. Step size (sampling interval) at the output of such DAC_0 is $$s = Y/(\alpha^{\psi} - 1).$$

In this case $Z = Y \times X$ and "classical" conversion $X \Rightarrow Z$ is used, wherein conversion accuracy is a linear function of accuracy of elementary electronics of DAC_0, i.e., resistor (condenser) arrays, current (voltage) switches etc., i.e., is defined by production technology of a given DAC_0 microchip and ultimate accuracy (dispersion) of nominal values of its internal circuitry.

In the conversion discussed above, both the first and the second method are prone to errors stipulated by the manufacture of DAC_0 circuitry. Main circuitry-related error factors are:

technology-related dispersion of parameters (precision of manufacture);

environmental changes (mainly temperature) effect—thermal stability;

changing parameters over time (ageing); and external and internal noise and interference effects.

Thus, conversion performance of real DAC_0 differs from ideal ones in the shape, interval values and their position relative to coordinate axes.

To improve conversion accuracy, internal structure of DAC_0 may be made more complex, accuracy and stability of parameters of the employed elements may be improved, but this is only possible within the manufacturability limits.

The above-mentioned reasons and, ultimately, technological manufacturability, restrict the maximum possible accuracy of parallel DAC_0, which presently does not exceed 20 . . . 22 binary digits (bits) of control code X.

A digital-to-analog conversion method is known, implementation example of which is shown in FIG. 2, where an initial DAC_0 shown in FIG. 1 is used (see [3. Tietze U., Schenk K. Semiconductor Circuit Engineering: Reference Manual. Translated from German. M. Mir, 1982.-512 pp., page 447, FIG. 24.7]).

FIG. 2 shows: DAC_2, signal adder 3, DAC_4, reference signal Y and clock signal t are provided to respective inputs of DAC_2 and DAC_4, and α digits long control words M and β digits long control words $a^{-\alpha}N$ are provided to their input buses. Output of DAC_4 is connected to an input of attenuator 5 having its output connected to the first input of signal adder 3, which has its second input connected to the output of DAC_2. Resulting analog signal $Z_0$ is provided at the output of signal adder 3.

In this conversion method, ψ digits long digital code word $X=M+a^{-\alpha}N$ is divided into two control codes M and $a^{-\alpha}N$ (preferably, but not necessarily having half length, ψ/2): ψ=α+β, where α is the number of high-order bits of control code X, and β is the number of the low-order bits of control code X Both DACs are clocked at the same times t.

Like the aforementioned analogues, this conversion also uses a single reference signal (dimensional scale) Y.

β long low-order digits $a^{-\alpha}N$ of control code X are multiplied in digital multiplier 1 by $a^{\alpha}$ times, thus providing a β digits control word N.

First DAC_2 converts the α digits long control word M into analog signal $Z_1$, second DAC_4 converts the β digits long control code N into analog signal $Z_2$.

Step size (sampling interval) at the output of DAC_2 is $s_1=Y/\alpha^{\alpha}>>Y/\alpha^{\psi}$, and step size (sampling interval) at the of DAC_4 is $s_2=Y/\alpha^{\beta}>>Y/\alpha^{\psi}$. In the case α≈β, steps sizes $s_1 \approx s_2$.

As such, variations of values (range) of the output signal $Z_1$ when control code M normalized to "one" changes from 0 to $(1-\alpha^{-\alpha})$ at the output of DAC_2 will be $Y(1-\alpha^{-\alpha})$, and the range of output signal $Z_2$ when control code N normalized to "one" changes from 0 to $(1-\alpha^{-\beta})$ at the output of DAC_4 will be $Y(1-\alpha^{-\beta})$.

In order to reduce the step size in the output signal $Z_0$ to the initial value, it is necessary to reduce the range of output signal $Z_2$ at the output of DAC_4 by $a^{\alpha}$ times by means of the analog attenuator 5 and to add the signal $Z_3=Z_2/\alpha_{\alpha}$ thus obtained to the output signal $Z_1$ of DAC_2 (which has step size $s_1=Y/\alpha^{\alpha}$ in the signal adder 3.

At the output of the signal adder 3 (see FIG. 2), there will be the output signal $Z_0=Z_1+Z_3$, which may change from 0 to $Y(1-\alpha^{-\psi})$ with the necessary sampling interval $s=Y/\alpha^{\psi}$.

Accuracy of conversion of reference signal Y into analog value $Z_0$ will be the same as in the prior art analog as shown in FIG. 1, but accuracy requirements for DAC_4 will be reduced by $a^{\alpha}$ times.

However, in the digital-to-analog conversion method discussed above it is necessary to provide for high accuracy of DAC_2 and analog attenuator 5 arranged between the output of DAC_4 and input of the signal adder 3.

The same stringent requirements as for DAC_0 shown in FIG. 1 also apply to these two analog components of the structure shown in FIG. 2. Accuracy of DAC_2 and attenuator 5 will restrict the resulting accuracy of the whole DAC shown in FIG. 2.

It is also noted that the accuracy of analog attenuator 5 not only depends on its own accuracy but also on the output resistance of DAC_4 and input resistance of signal adder 3, which may vary within the range of operational frequencies.

Conversion method implemented in the parallel DAC structure illustrated in FIG. 2 is taken as the prototype.

SUMMARY

Technical Problem

Technical result of the invention consists in improved accuracy of conversion of analog value by means of digital processing of control code and using at least two different dimensional scales Y.

Solution to Problem

The technical result is achieved in the provided method of Vernier digital-to-analog conversion, wherein reference signal Y is converted to an analog output signal $Z_0$ by means of control word $X=M+a^{-\alpha}N$ having a length of ψ=α+β digits, where M is high order bits of α long control word X, $a^{-\alpha}N$ is low order bits of β long control word X, wherein α≈β, and two parallel conversions are carried out in respect of analog signal Z, wherein, in the first conversion, first output analog signal $Z_1$ is proportional to M high order bits of a long control word X, and to reference signal $Y_1$, i.e., $Z_1=Y_1 \times M$, in the second conversion, second output analog signal $Z_2$ is proportional to N low order bits of β long control word X and to reference signal $Y_1$, i.e., $Z_2=Y1 \times N$, wherein, before said parallel conversions, digital multiplication of $a^{-\alpha}N$ low order bits of control word X by $a^{\alpha}$ times is performed (left shift by α bits), and the converted analog signals $Z_1$, $Z_2$ are summed, characterized in that third parallel conversion is performed on analog signal Z wherein third analog output signal $Z_3$ is proportional to N low order bits of β long control word X and to reference signal $Y_2$, i.e., $Z_3=Y_2 \times N$, wherein reference signals $Y_1$ and $Y_2$ are related through the following dependency:

$$Y_2=Y_1(1 \pm \alpha^{-\alpha}),$$

where a is base of numeral system, α is a number of bits, by which control code $a^{-\alpha}N$ is shifted, after which the converted analog signal $Z_1$, $Z_2$, and $Z_3$ are summed to provide output signal $Z_0$.

As such, conversion scale is selected to be the same in parallel conversion of analog signals $Z_1$, $Z_2$, and $Z_3$ into output signal $Z_0$.

Meanwhile, if reference signal $Y_2$ is generated according to the expression:

$$Y_2=Y_1(1+\alpha^{-\alpha}),$$

then analog of output signals $Z_1$, $Z_2$, and $Z_3$ is carried out by their algebraic addition according to the expression:

$$Z_0=Z_1+Z_3-Z_2.$$

If reference signal $Y_2$ is generated according to the expression:

$$Y_2=Y_1(1-\alpha^{-\alpha}),$$

then analog conversion of output signals $Z_1$, $Z_2$, and $Z_3$ is carried out by their algebraic addition according to the expression:

$$Z_0=Z_1+Z_2-Z_3.$$

Achievement of the technical result in the claimed method by the aforementioned distinguishing features will be now explained.

The claimed method is based on the principle of Vernier conversion, i.e., using at least two dimensional scales having a fractional ratio, i.e., carrying out three conversions:

$$X \to Z_1; X \to Z_2; X \to Z_3; (Z_1, Z_2, Z_3) \to Z_0.$$

In other words, there is a pair of dimensional scales (reference signals Y), dependency between which is:

$$Y_2 = Y_1(1 \pm \alpha^{-\alpha}),$$

wherein the structure of number X is presented as follows (artificial partition):

$$X = X_{\alpha+\beta} X_{\alpha+\beta-1} \ldots X_2 X_1 = M\alpha^{-\infty} N$$

where M is a α long group of high order digits, and $a^{-\alpha}N$ is a β long group of low order digits of number X in the selected numbering system. In practice, number N is a result of multiplying $a^{-\alpha}N$ by $a^{\alpha}$ times (shifted by α digits to the left), i.e., digitally multiplied by $a^{\alpha}$ times. The following expression is then possible:

$$Z_1 = Y_1 M = Y_1 \times \sum_{k=1}^{\alpha} q_\alpha a^{-\alpha};$$

$$Z_2 = Y_1 N = Y_1 \times \sum_{k=1}^{\beta} q_\beta a^{-\beta};$$

$$Z_3 = Y_1 N$$
$$= Y_1(1 \pm a^{-\alpha})$$
$$= Y_1 \times \left( \sum_{k=1}^{\beta} q_\beta a^{-\beta} \pm a^{-\alpha} \sum_{k=1}^{\beta} q_\beta a^{-\beta} \right);$$

$$Z_0 = Z_1 \mp Z_2 \pm Z_3 = Y_1 M \mp Y_1 N \pm Y_2 N =$$

$$Y_1 \left[ \sum_{k=1}^{\alpha} q_\alpha a^{-\alpha} \mp \sum_{k=1}^{\beta} q_\beta a^{-\beta} \right] \pm Y_1 (1 \pm a^{-\alpha}) \left[ \sum_{k=1}^{\beta} q_\beta a^{-\beta} \right] =$$

$$Y_1 \left\{ \sum_{k=1}^{\alpha} q_m a^{-\alpha} \mp \sum_{k=1}^{\beta} q_\beta a^{-\beta} \pm \sum_{k=1}^{\beta} q_\beta a^{-\beta} + a^{-\alpha} \sum_{k=1}^{\beta} q_\beta a^{-\beta} \right\}.$$

The following conditions should then be met:
in the algebraic addition of signals $Z_1$, $Z_2$, and $Z_3$ in the output analog adder, signal $Z_3$ should be subtracted from signal $Z_2$, as should be the second reference signal in accordance with the expression:

$$Z_0 = Z_1 + Z_2 - Z_3$$

$$= Y_1 \left[ \sum_{k=1}^{\alpha} q_\alpha a^{-\alpha} + \sum_{k=1}^{\beta} q_\beta a^{-\beta} \right] - Y_1(1 - a^{-\alpha}) \left[ \sum_{k=1}^{\beta} q_\beta a^{-\beta} \right]$$

$$= Y_1 \left\{ \sum_{k=1}^{\alpha} q_\alpha a^{-\alpha} + a^{-\alpha} \sum_{k=1}^{\beta} q_\beta a^{-\beta} \right\},$$

in the algebraic addition of signals $Z_1$, $Z_2$, and $Z_3$ in the output analog adder, signal $Z_2$ should be subtracted from signal $Z_3$ in accordance with the expression:

$$Z_0 = Z_1 + Z_2 - Z_3$$

$$= Y_1 \left[ \sum_{k=1}^{\alpha} q_\alpha a^{-\alpha} + \sum_{k=1}^{\beta} q_\beta a^{-\beta} \right] - Y_1(1 - a^{-\alpha}) \left[ \sum_{k=1}^{\beta} q_\beta a^{-\beta} \right]$$

$$= Y_1 \left\{ \sum_{k=1}^{\alpha} q_\alpha a^{-\alpha} + a^{-\alpha} \sum_{k=1}^{\beta} q_\beta a^{-\beta} \right\},$$

wherein the second reference signal $Y_2 = Y_1(1+\alpha^{-\alpha})$.

As follows from the aforementioned expressions, these conversions bring about the same result, which provides for the necessary accuracy of conversion of digital control code X into the analog value $Z_0$:

$$Z_0 = Y_1 \{ \Sigma_{k=1}^{\alpha} q_\alpha \alpha^{-\alpha} + \alpha^{-\alpha} \Sigma_{k=1}^{\beta} q_\beta \alpha^{-\beta} \}.$$

DETAILED DESCRIPTION

Figure 1:
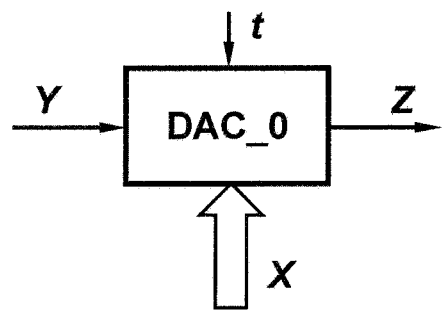
FIG. 1 shows a digital-to-analog converter (DAC) known from the prior art.
Figure 2:
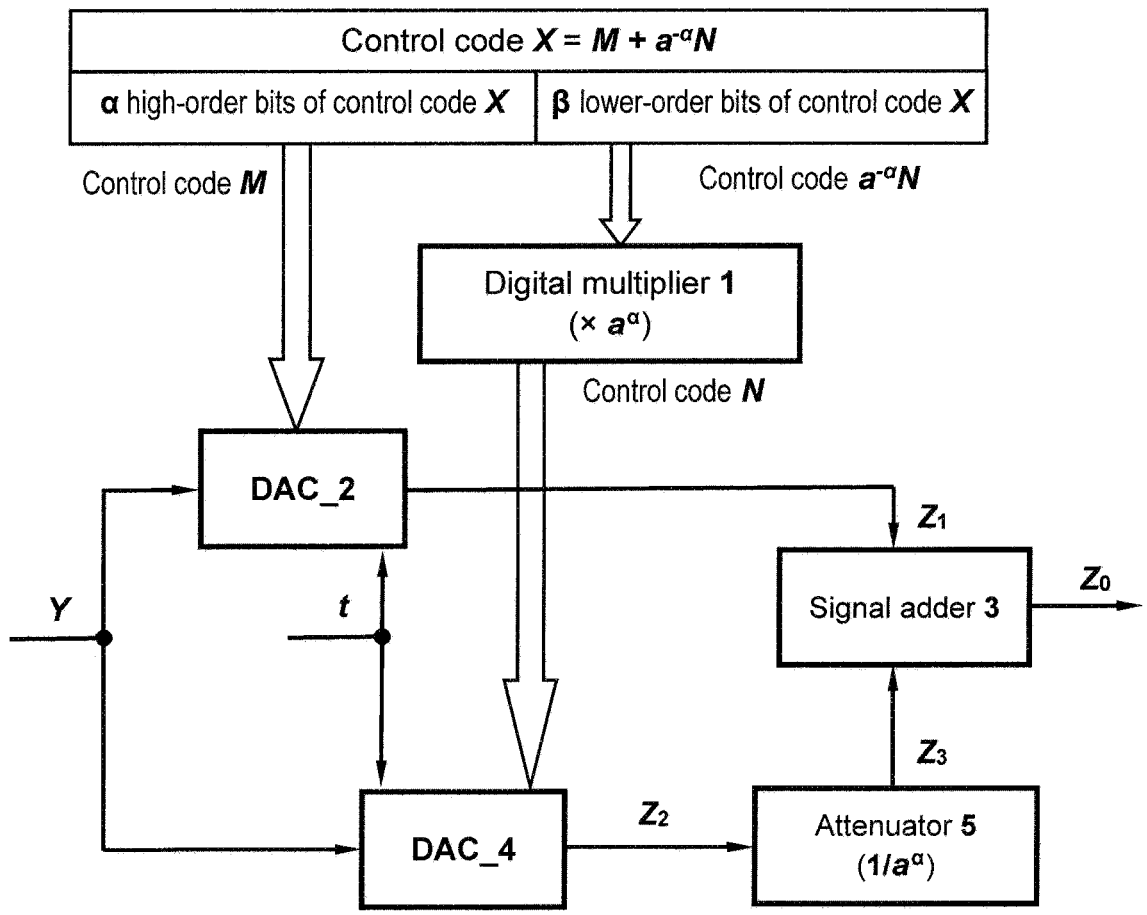
FIG. 2 shows a parallel digital-to-analog converter and method using the DAC as shown in Fig. 1, known from the prior art.
Figure 3:
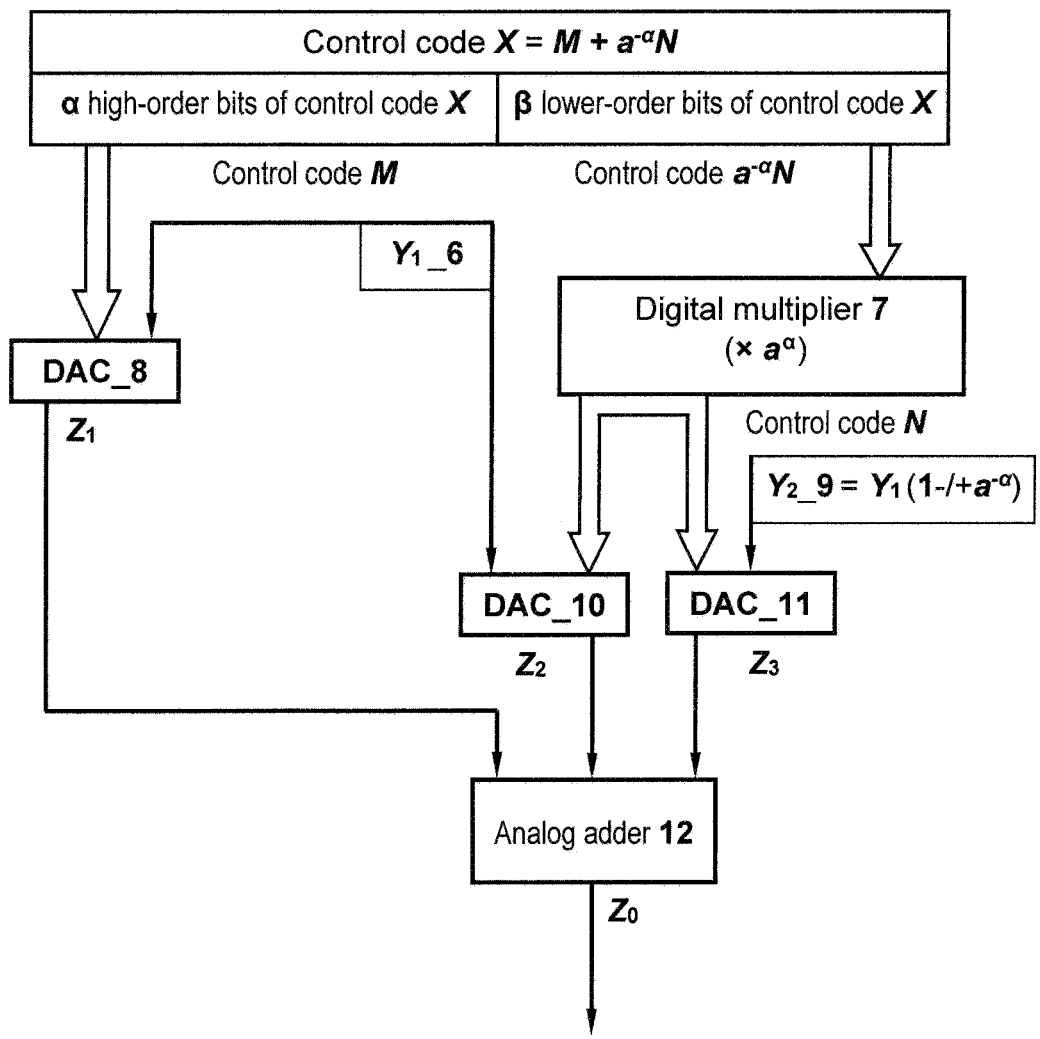
FIG. 3 shows a Vernier digital-to-analog converter and method.

Structural scheme of one of the possible embodiments of Vernier digital-to-analog converter (DAC) which implements the claimed method is shown in FIG. 3, which shows:
Reference signal $Y_1$ source 6,
Digital multiplier 7,
First DAC_8,
Reference signal $Y_2$ source 9,
Second DAC_10,
Third DAC_11,
Analog adder 12.

In the digital multiplier 7, β low order digits of control word $a^{-\alpha}N$ are subjected to digital multiplication by $a^{\alpha}$ times (shift by a digits to the left). Output bus of α high order digits of control word M is connected to the respective input control bus of DAC_8, and the other input of the latter being connected to the output of reference signal $Y_1$ source 6. Output of the DAC_8 is connected to the respective input of analog adder 12, and the other inputs of the latter being connected to the output of DAC_10 and output of DAC_11, while β low order digits of control word N (control word $a^{-\alpha}N$, which has been digitally multiplied by $a^{\alpha}$ times (shift by α digits to the left)) are provided to the input control bus of DAC_10 and DAC_11, the other input of DAC_10 being connected to the output of reference signal $Y_1$ source 6, and the respective input of DAC_11 being connected to the output of reference signal $Y_2$ source 9, wherein the dimensional scales (reference signals) $Y_1$ and $Y_2$ are related through the following dependency:

$$Y_2 = Y_1(1 \pm \alpha^{-\alpha}).$$

Analog output signal $Z_0$ is obtained at the output of analog adder 12.

As a numeric example, an embodiment of Vernier conversion of a decimal number into an abstract analog parameter Z is shown.

Since the numbering system is decimal, a two-digit digital word $X_{(10)}$ is partitioned into two one-digit ones, M and N, and reference signals Y will then be: $Y_1=1.0$; $Y_2=1.1 \times Y_1$.

EXAMPLES

There are two illustrative variants: one for the case of $M_1 > N$ and the other one for the case of $M_2 < N$. Let $M_1 = 7$ and $M_2 = 3$, and N have the values from 0 to 9. The steps of these calculations and conversions are summarized in Table 1 and Table 2 provided below.

TABLE 1

| | | $Y_2 = 1.1 \times Y_1$ | | | |
|---|---|---|---|---|---|
| $M_1$ | N | $Z_1 = Y_1 \times M$ | $Z_2 = Y_1 \times N$ | $Z_3 = Y_2 \times N$ | $Z_0 = Z_1 - Z_2 + Z_3$ |
| 7 | 0 | 7 | 0 | 0.0 | 7.0 |
| 7 | 1 | 7 | 1 | 1.1 | 7.1 |
| 7 | 2 | 7 | 2 | 2.2 | 7.2 |
| 7 | 3 | 7 | 3 | 3.3 | 7.3 |
| 7 | 4 | 7 | 4 | 4.4 | 7.4 |
| 7 | 5 | 7 | 5 | 5.5 | 7.5 |
| 7 | 6 | 7 | 6 | 6.6 | 7.6 |

TABLE 1-continued $Y_2 = 1.1 \times Y_1$

| $M_1$ | N | $Z_1 = Y_1 \times M$ | $Z_2 = Y_1 \times N$ | $Z_3 = Y_2 \times N$ | $Z_0 = Z_1 - Z_2 + Z_3$ |
|---|---|---|---|---|---|
| 7 | 7 | 7 | 7 | 7.7 | 7.7 |
| 7 | 8 | 7 | 8 | 8.8 | 7.8 |
| 7 | 9 | 7 | 9 | 9.9 | 7.9 |

TABLE 2

$Y_2 = 1.1 \times Y_1$

| $M_2$ | N | $Z_1 = Y_1 \times M$ | $Z_2 = Y_1 \times N$ | $Z_3 = Y_2 \times N$ | $Z_0 = Z_1 - Z_2 + Z_3$ |
|---|---|---|---|---|---|
| 3 | 0 | 3 | 0 | 0.0 | 3.0 |
| 3 | 1 | 3 | 1 | 1.1 | 3.1 |
| 3 | 2 | 3 | 2 | 2.2 | 3.2 |
| 3 | 3 | 3 | 3 | 3.3 | 3.3 |
| 3 | 4 | 3 | 4 | 4.4 | 3.4 |
| 3 | 5 | 3 | 5 | 5.5 | 3.5 |
| 3 | 6 | 3 | 6 | 6.6 | 3.6 |
| 3 | 7 | 3 | 7 | 7.7 | 3.7 |
| 3 | 8 | 3 | 8 | 8.8 | 3.8 |
| 3 | 9 | 3 | 9 | 9.9 | 3.9 |

The only units of the Vernier DAC (FIG. 3), to which strict requirements for precision should apply, are output analog adder 12, reference signal $Y_1$ source 8, and reference signal $Y_2$ source 9, wherein their implementation does not involve any inextricable difficulties; moreover, they are common for (high) precision electronics.

So, e.g., in case of a twenty-digit binary input word ($\alpha=\beta=10$) and $Y_1=10$ V, the necessary relative accuracy of analog adder and source is $Y_1 \delta_\alpha \leq 2^{-20} \approx 10^{-6}$ (absolute accuracy is 9.5 μV), which is readily implementable using the current microelectronic hardware components.

In the case of $Y_2=0.9 \times Y_1$ and the numeric parameters being the same, the result will be as follows:

TABLE 3

$Y_2 = 0.9 \times Y_1$

| M | N | $Z_1 = Y_1 \times M$ | $Z_2 = Y_1 \times N$ | $Z_3 = Y_2 \times N$ | $Z_0 = Z_1 + Z_2 - Z_3$ |
|---|---|---|---|---|---|
| 7 | 0 | 7 | 0 | 0.0 | 7.0 |
| 7 | 1 | 7 | 1 | 0.9 | 7.1 |
| 7 | 2 | 7 | 2 | 1.8 | 7.2 |
| 7 | 3 | 7 | 3 | 2.7 | 7.3 |
| 7 | 4 | 7 | 4 | 3.6 | 7.4 |
| 7 | 5 | 7 | 5 | 4.5 | 7.5 |
| 7 | 6 | 7 | 6 | 5.4 | 7.6 |
| 7 | 7 | 7 | 7 | 6.3 | 7.7 |
| 7 | 8 | 7 | 8 | 7.2 | 7.8 |
| 7 | 9 | 7 | 9 | 8.1 | 7.9 |

TABLE 4

$Y_2 = 0.9 \times Y_1$

| M | N | $Z_1 = Y_1 \times M$ | $Z_2 = Y_1 \times N$ | $Z_3 = Y_2 \times N$ | $Z_0 = Z_1 + Z_2 - Z_3$ |
|---|---|---|---|---|---|
| 3 | 0 | 3 | 0 | 0.0 | 3.0 |
| 3 | 1 | 3 | 1 | 0.9 | 3.1 |
| 3 | 2 | 3 | 2 | 1.8 | 3.2 |
| 3 | 3 | 3 | 3 | 2.7 | 3.3 |
| 3 | 4 | 3 | 4 | 3.6 | 3.4 |
| 3 | 5 | 3 | 5 | 4.5 | 3.5 |
| 3 | 6 | 3 | 6 | 5.4 | 3.6 |
| 3 | 7 | 3 | 7 | 6.3 | 3.7 |
| 3 | 8 | 3 | 8 | 7.2 | 3.8 |
| 3 | 9 | 3 | 9 | 8.1 | 3.9 |

In the claimed conversion method, in the case of any ratio between numbers N and M, no loss of digits occurs while the accuracy of digital-to-analog conversion is increased by $\approx a^{\alpha-1}$ times, as the error is significantly reduced and, hence, accuracy of parallel digital-to-analog conversion is increased without stricter requirements for DAC components manufacturing technology.

Improved conversion accuracy is stipulated by the fact that, in the case of analog addition, other conditions being equal, requirements for the accuracy of adder unit are less strict than the requirements for the accuracy of analog attenuator in the case of analog division of signal Z.

Besides, accuracy of reference signals (dimensional scales) $Y_1$, $Y_2$ and their ratio needs to be provided at one point and under direct current (under constant values of current or voltage), which is significantly simpler than doing it throughout the range of output levels of Z and operational frequencies.

The following circumstance is repeatedly emphasized: for any method of digital-to-analog conversion (double and greater integration, sigma-delta, pipelined, sequential approximation, Vernier, etc.), requirements for the accuracy of analog components are only defined by the necessary accuracy of conversion.

Weighted contribution of individual analog elements of the digital-to-analog converter which implements the claimed method into the pool of acceptable errors of the device as a whole depends on its specific circuitry implementation. And, naturally, the known rule applies:

the stricter the requirements for conversion accuracy, the stricter (at least linearly) the requirements for analog components.

Requirements for accuracy and stability of reference voltage (current) sources and analog algebraic adders of input/output voltages (currents) do not depend on the chosen conversion method, and their contribution is small.

The main contribution into the pool of errors is provided by the DAC per se (which is explicitly or implicitly included in the structure of Vernier digital-to-analog conversion) via errors in voltage/current keys and R (C) arrays.

Use of identical resistors makes it possible to significantly improve the accuracy as compared to an ordinary weighted DAC, since it is comparatively easy to make a set of precision elements with identical parameters. R-2R type DACs enable shifting, but not lifting restrictions concerning the number of digits. By virtue of laser trimming of film resistors arranged on the same substrate of a hybrid microchip, 20-22 bit accuracy of DAC may be achieved.

For this reason, relaxation of requirements for DACs in the form of reducing the required number of digits $\psi=\alpha+\beta$ of control word X while retaining the resulting accuracy of conversion is of such practical importance.

An example of configuration of the elements in the structural scheme implementing the claimed conversion method is shown.

DACs 8, 10, and 11 may be configured by the following microchips: double DAC AD5763, single DAC K594PA1, K1108PA1 or similar ones. Reference signal sources 6 and 9 may be configured by microchips LT6657 (precision voltage source) or LT3092 (precision current source).

To perform digital multiplication by $\alpha$ times of N low order digits of control word X (left shift by $\alpha$ digits), shift register microchips—universal registers KR1533IR8 (SN74HC164) may be used.

The invention claimed is:

1. A method of Vernier digital-to-analog conversion, wherein the method comprises:

converting reference signal Y using control word $X=M+\alpha^{-\alpha}N$ having a length of $\psi=\alpha+\beta$ digits, wherein M is high order digits of $\alpha$ long control word X, $\alpha^{-\alpha}N$ is low order digits of $\beta$ long control word X, wherein $\alpha \approx \beta$, performing two parallel conversions on an analog signal Z, wherein, in a first conversion, a first output analog signal $Z_1$ is proportional to the M high order digits of $\alpha$ long control word X, and to a reference signal $Y_1$, where $Z_1=Y_1 \times M$, in a second conversion, a second output analog signal $Z_2$ is proportional to N low order digits of $\beta$ long control word X and to a reference signal $Y_1$, where $Z_2=Y_1 \times N$, wherein, prior to the two parallel conversions, digital multiplication of the $\alpha^{-\alpha}N$ low order digits of the control word X by $\alpha_\alpha$ times is performed;

performing a third parallel conversion on the analog signal Z, in which a third output analog signal $Z_3$ is proportional to N low order digits of $\beta$ long control word X, and to a reference signal $Y^1$, where $Z_3=Y_2 \times N$, wherein the reference signal $Y_1$ and the reference signal $Y_2$ are related through a dependency $Y_2=Y_1(1 \pm \alpha^{-\alpha})$, wherein $\beta$ is a base of a numbering system, and $\alpha$ is a number of digits by which control code $\alpha^{-\alpha}N$ is shifted; and adding the first output analog signal $Z_1$, the second output analog signal $Z_2$, and the third output analog signal $Z_3$ to generate an analog output signal $Z_0$.

2. The method of claim 1, wherein in the two parallel conversions of the first analog signal $Z_1$ and the second output analog signal $Z_2$, and the parallel conversion of the third output analog signal $Z_3$, a conversion scale is selected to be the same.

3. The method of claim 1, wherein, when the reference signal $Y_2$ is generated according to an expression $Y_2=Y_1(1+\alpha^{-\alpha})$, the first output analog signal $Z_1$, the second output analog signal $Z_2$, and the third output analog signal $Z_3$ are added to generate the analog output signal $Z_0$ according to an expression: $Z_0=Z_1+Z_3-Z_2$.

4. The method of claim 1, wherein when the reference signal $Y_2$ is generated according to an expression $Y_2=Y_1(1-\alpha^{-\alpha})$, the first output analog $Z_1$, the second output analog signal $Z_2$, and the third output analog signal $Z_3$ are added to generate the analog output signal $Z_0$ according to an expression: $Z_0=Z+Z_2-Z_3$.

* * * * *

UNITED STATES PATENT AND TRADEMARK OFFICE
CERTIFICATE OF CORRECTION

PATENT NO. : 11,736,117 B2
APPLICATION NO. : 17/621380
DATED : August 22, 2023
INVENTOR(S) : Yury Alexandrovich Nikitin It is certified that error appears in the above-identified patent and that said Letters Patent is hereby corrected as shown below:

On the Title Page

IN THE ABSTRACT:

Line 2:
Now reads: "$X = M + \alpha^{-\alpha}N$"
Should read: -- $X = M + a^{-\alpha}N$ --

Line 3:
Now reads: "$\alpha^{-\alpha}N$"
Should read: -- $a^{-\alpha}N$ --

Line 11:
Now reads: "$\alpha^{-\alpha}N$"
Should read: -- $a^{-\alpha}N$ --

Line 12:
Now reads: "$\alpha^{\alpha}$;"
Should read: -- $a^{\alpha}$; --

Line 14:
Now reads: "$Y_2 = Y_1(1 \pm \alpha^{-\alpha})$,"
Should read: -- $Y_2 = Y_1(1 \pm a^{-\alpha})$, --

Line 14:
Now reads: "wherein $\alpha$ is"
Should read: -- wherein a is --

Line 15:
Now reads: "$\alpha^{-\alpha}N$"

Signed and Sealed this
Second Day of January, 2024

*Katherine Kelly Vidal*
*Director of the United States Patent and Trademark Office*

CERTIFICATE OF CORRECTION (continued)
U.S. Pat. No. 11,736,117 B2

Should read: -- $a^{-\alpha}N$ --

In the Specification

Column 2, Line 3:
Now reads: "$0 \leq X = \Sigma_{k=0}^{\Psi-1} q_k \times \alpha^{-k} < 1,$"
Should read -- $0 \leq X = \sum_{k=0}^{\Psi-1} q_k \times a^{-k} < 1,$ Column 2, Line 10:
Now reads: "$Z = hY(\alpha_{k-1}2^{k-1} + \alpha_{k-2}2^{k-2} + \cdots + \alpha_0 2^0)$"
Should read: -- $Z = hY(a_{k-1}2^{k-1} + a_{k-2}2^{k-2} + \cdots + a_0 2^0)$ --

Column 2, Line 11:
Now reads: "$q \in (\alpha_0, \alpha_1, \ldots, \alpha_{k-1}) \equiv [0,1]$"
Should read: -- $q \in (a_0, a_1, \ldots, a_{k-1}) \equiv [0,1]$ --

Column 2, Line 18:
Now reads: "$0 \leq X = \Sigma_{k=0}^{\Psi-1} q_k \times \alpha^{-k} < 1,$"
Should read: -- $0 \leq X = \sum_{k=0}^{\Psi-1} q_k \times a^{-k} < 1,$ --

Column 2, Line 19:
Now reads: "$\alpha = 10;$"
Should read: -- $a = 10;$ --

Column 2, Line 36:
Now reads: "$s = Y/(\alpha^\Psi - 1)$"
Should read: -- $s = Y/(a^\Psi - 1)$ --

Column 3, Line 6:
Now reads: "and a digit long control"
Should read: -- and α digit long control --

Column 3, Line 29:
Now reads: "$s_1 = Y/\alpha^\alpha \gg Y/\alpha^\Psi$"
Should read: -- $s_1 = Y/a^\alpha \gg Y/a^\Psi$ --

Column 3, Line 29:
Now reads: "at the of"
Should read: -- at the output of --

Column 3, Line 30:
Now reads: "$s_2 = Y/\alpha^\beta \gg Y/\alpha^\Psi$"

Should read: -- $s_2 = Y/a^\beta \gg Y/a^\psi$ --

Column 3, Line 34:
Now reads: "0 to $(1 - \alpha^{-\alpha})$"
Should read: -- 0 to $(1 - a^{-\alpha})$ --

Column 3, Line 34:
Now reads: "will be $Y(1 - \alpha^{-\alpha})$"
Should read: -- will be $Y(1 - a^{-\alpha})$ --

Column 3, Line 36:
Now reads: "0 to $(1 - \alpha^{-\beta})$"
Should read: -- 0 to $(1 - a^{-\beta})$ --

Column 3, Line 37:
Now reads: "will be $Y(1 - \alpha^{-\beta})$"
Should read: -- will be $Y(1 - a^{-\beta})$ --

Column 3, Line 42:
Now reads: "$Z_3 = Z_2/\alpha^\alpha$"
Should read: -- $Z_3 = Z_2/a^\alpha$ --

Column 3, Line 44:
Now reads: "$s_1 = Y/\alpha^\alpha$ "
Should read: -- $s_1 = Y/a^\alpha$ --

Column 3, Line 47:
Now reads: "$Y(1 - \alpha^{-\psi})$ with"
Should read: -- $Y(1 - a^{-\psi})$ with --

Column 3, Line 47:
Now reads: "interval $s = Y/\alpha^\psi$"
Should read: -- interval $s = Y/a^\psi$ --

Column 4, Line 35:
Now reads: "$Y_2 = Y_1(1 \pm \alpha^{-\alpha})$"
Should read: -- $Y_2 = Y_1(1 \pm a^{-\alpha})$ --

Column 4, Line 46:
Now reads: "$Y_2 = Y_1(1 + \alpha^{-\alpha})$"
Should read: -- $Y_2 = Y_1(1 + a^{-\alpha})$ --.

Column 4, Line 54:
Now reads: "$Y_2 = Y_1(1 - \alpha^{-\alpha})$"
Should read: -- $Y_2 = Y_1(1 - a^{-\alpha})$ --

CERTIFICATE OF CORRECTION (continued)
U.S. Pat. No. 11,736,117 B2

Column 5, Line 3:
Now reads: "$Y_2 = Y_1(1 \pm \alpha^{-\alpha})$"
Should read: -- $Y_2 = Y_1(1 \pm a^{-\alpha})$ --

Column 5, Line 7:
Now reads: "$X = X_{\alpha+\beta}X_{\alpha+\beta-1} \ldots X_2X_1 \equiv M\alpha^{-\alpha}N$"
Should read: -- $X = X_{\alpha+\beta}X_{\alpha+\beta-1} \ldots X_2X_1 \equiv M\alpha^{-\alpha}N$ --.

Column 5, Line 21:
Now reads: "$Y_1(1 \pm \alpha^{-\alpha})$"
Should read: -- $Y_1(1 \pm \alpha^{-\alpha})$"

Column 5, Line 22:
Now reads: "$= Y_1 \times (\sum_{k=1}^{\beta} q_\beta\, a^{-\beta} \pm a^{-\alpha} \sum_{k=1}^{\beta} q_\beta\, a^{-\beta})$,,
Should reads: -- $= Y_1 \times (\sum_{k=1}^{\beta} q_\beta\, a^{-\beta} \pm a^{-\alpha} \sum_{k=1}^{\beta} q_\beta\, a^{-\beta})$ --

Column 5, Line 55:
Now reads: "$Y_2 = Y_1(1 + \alpha^{-\alpha})$"
Should read: -- $Y_2 = Y_1(1 + a^{-\alpha})$ --

Column 5, Line 60:
Now reads: "$Z_0 = Y_1 \left\{ \sum_{k=1}^{\alpha} q_\alpha\, \alpha^{-\alpha} + \alpha^{-\alpha} \sum_{k=1}^{\beta} q_\beta\, \alpha^{-\beta} \right\}$,,
Should read: -- $Z_0 = Y_1 \left\{ \sum_{k=1}^{\alpha} q_\alpha\, a^{-\alpha} + a^{-\alpha} \sum_{k=1}^{\beta} q_\beta\, a^{-\beta} \right\}$ --

Column 6, Line 21:
Now reads: "(shift by a digits to the left)"
Should read: -- (shift by α digits to this left). --

Column 6, Line 37:
Now reads: "$Y_2 = Y_1(1 \pm \alpha^{-\alpha})$"
Should read: -- $Y_2 = Y_1(1 \pm a^{-\alpha})$ --

Column 7, Line 35:
Now reads: "$Y_1\, \delta_\alpha \leq 2^{-20} \approx 10^{-6}$"
Should read: -- $Y_1\, \delta_\alpha \leq 2^{-20} \approx 10^{-6}$ --

In the Claims
Claim 1, Column 9, Lines 15-16:
Now reads: "$X = M + \alpha^{-\alpha}N$"
Should read: -- $X = M + a^{-\alpha}N$ --

CERTIFICATE OF CORRECTION (continued)
U.S. Pat. No. 11,736,117 B2

Claim 1, Column 9, Line 17:
Now reads: "$\alpha^{-\alpha}N$"
Should read: -- $a^{-\alpha}N$ --

Claim 1, Column 9, Line 27:
Now reads: "$\alpha^{-\alpha}N$"
Should read: -- $a^{-\alpha}N$ --

Claim 1, Column 9, Line 28:
Now reads: "$\alpha_\alpha$"
Should read: -- $a^\alpha$ --

Claim 1, Column 10, Line 6:
Now reads: "$Y_2 = Y_1(1 \pm \alpha^{-\alpha})$"
Should read: -- $Y_2 = Y_1(1 \pm a^{-\alpha})$ --

Claim 1, Column 10, Line 7:
Now reads: "wherein β"
Should read: -- wherein a --

Claim 1, Column 10, Line 8:
Now reads: "$\alpha^{-\alpha}N$"
Should read: -- $a^{-\alpha}N$ --

Claim 3, Column 10, Lines 18-19:
Now reads: "$Y_2 = Y_1(1 + \alpha^{-\alpha})$"
Should read: -- $Y_2 = Y_1(1 + a^{-\alpha})$ --

Claim 4, Column 10, Line 25:
Now reads: "$Y_2 = Y_1(1 - \alpha^{-\alpha})$"
Should read: -- $Y_2 = Y_1(1 - a^{-\alpha})$ --